United States Patent
Zhou et al.

(10) Patent No.: US 8,779,204 B2
(45) Date of Patent: Jul. 15, 2014

(54) FLUORENE COPOLYMER, METHOD FOR PREPARATION AND USE THEREOF

(75) Inventors: Mingjie Zhou, Shenzhen (CN); Jie Huang, Shenzhen (CN); Hui Liu, Shenzhen (CN)

(73) Assignee: Ocean's King Lighting Science & Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/635,342

(22) PCT Filed: Apr. 23, 2010

(86) PCT No.: PCT/CN2010/072097
§ 371 (c)(1),
(2), (4) Date: Sep. 14, 2012

(87) PCT Pub. No.: WO2011/130915
PCT Pub. Date: Oct. 27, 2011

(65) Prior Publication Data
US 2013/0005932 A1   Jan. 3, 2013

(51) Int. Cl.
  *C07C 211/00*  (2006.01)
  *H01L 51/00*  (2006.01)
  *C08G 61/12*  (2006.01)
  *H01L 51/42*  (2006.01)

(52) U.S. Cl.
  CPC .... *H01L 51/0043* (2013.01); *C08G 2261/3223* (2013.01); *C08G 2261/526* (2013.01); *C08G 2261/91* (2013.01); *C08G 2261/3242* (2013.01); *H01L 51/42* (2013.01); *Y02E 10/549* (2013.01); *C08G 2261/3142* (2013.01); *H01L 51/0039* (2013.01); *C08G 2261/3246* (2013.01); *C08G 61/123* (2013.01); *C08G 2261/411* (2013.01); *C08G 2261/92* (2013.01); *C08G 2261/95* (2013.01); *C08G 2261/1412* (2013.01); *C08G 61/126* (2013.01); *H01L 51/0036* (2013.01)
  USPC .......................... 564/426; 428/690; 528/380

(58) Field of Classification Search
  USPC ................ 428/690; 528/377, 378, 380; 252/301.16; 564/426; 549/41, 456, 549/160, 349, 331; 136/263
  See application file for complete search history.

(56) References Cited

U.S. PATENT DOCUMENTS

2007/0232812 A1* 10/2007 Heeney et al. ............ 549/50
2008/0262183 A1* 10/2008 Lehmann ................... 528/7

FOREIGN PATENT DOCUMENTS

JP     2009-215349 A    9/2009

OTHER PUBLICATIONS

Janietz, Silvia, et al. Tailoring of Low Bandgap Polymer and its Performance Analysis in Organic Solar Cells. Macromolecular Chemistry and Physics. 2009, vol. 210, No. 18, pp. 1493-1503.
Shimelis Admassie, et al. Electrochemical and optical studies of the band gaps of alternating polyfluorene copolymers, Synthetic Metals, 2006, vol. 156, pp. 614-623.

(Continued)

*Primary Examiner* — Shane Fang
(74) *Attorney, Agent, or Firm* — Shimokaji & Associates P.C.

(57) ABSTRACT

A fluorene copolymer, method for preparation thereof, and use thereof are provided. Said fluorene copolymer comprises copolymer represented by formula (I), wherein $R_1$-$R_2$, $R_5$-$R_8$ are selected from H or $C_1$-$C_{20}$ alkyl, $R_3$-$R_4$ are selected from H, $C_1$-$C_{20}$ alkyl, $C_1$-$C_{20}$ alkoxyl, phenyl or phenoxyl, x+y=1, x≠0, y≠0; n is an integer of 1 to 200, $Ar_1$ is thiophene unit-containing group. On account of thiophene unit and thienopyrazine unit, the fluorene copolymer has wide spectrum response range and favorable stability.

4 Claims, 3 Drawing Sheets

(I)

(56) References Cited

OTHER PUBLICATIONS

Y.Xia et al., Novel random low-band-gap fluorene-based copolymers for deep red/near infrared light-emitting diodes and bulk heterojunction photovoltaic cells, Macromolecular Chemistry and Physics, 2006, 207 (5), 511-520.

Office Action from JPO, issued Nov. 12, 2013, corresponding to the U.S. Appl. No. 13/635,342.

* cited by examiner (I)

S10 — providing compounds A, B and C, the compounds are represented by the following formulas, respectively S20 — in the presence of catalyst, alkaline solution and organic solvent, compounds A, B and C were carried out the Suzuki polymerization to produce the copolymer represented by the following formula (I):

FLUORENE COPOLYMER, METHOD FOR PREPARATION AND USE THEREOF

FIELD OF THE INVENTION

The present invention relates to organic material technology, especially to a fluorene copolymer containing thienopyrazine unit, preparation method thereof, and use thereof.

BACKGROUND OF THE INVENTION

Organic material has been the research focus, which popularly used in copolymer material at present. Researches and developments involved in it are increasing. As being a kind of optoelectronic material or semiconductor material, copolymer material is becoming one of hotspots in the field of energy. A typical application is solar cell, for example.

A persistent difficulty and research focus in photovoltaic field is to take advantage of low-priced material to produce low-cost solar cell with high efficiency. Solar cells convert sunlight into electrical energy, which is a feasible and effective method for utilizing solar energy. However, the commercial solar cells nowadays are restricted to silicon substrate and other inorganic solar cells. The high price that most people cannot afford, greatly limits the scope of their use. In order to reduce battery costs and expand the scope of application, it has been a long time that people turned to organic solar cells. Inorganic semiconductor material features limited resources, high price, poisonous, complicated preparation process and high cost. Compared to these, solar cell has some advantages which cannot be matched by inorganic solar cell, such as extensive material source, diversity of controllable structure, low cost, safety, simple process, light quality and it can be flexibly manufactured on a large scale. Possessing important development and application prospects, it can be implemented in building construction, lighting, power generation and other fields. Thus, it draws much attention and investment of many domestic and international research institutions and enterprises.

Nevertheless, efficiency of photon-to-electron conversion of copolymer solar cell is much lower than that of inorganic solar cell so far. Thus, it is meaningful to develop new organic optoelectronic materials for improvement of efficiency of organic solar cell and other semiconductor devices.

SUMMARY OF THE INVENTION

For that reason, a fluorene copolymer containing thienopyrazine unit with good stability which has wide wavelength range of spectrum response and a simple, low-cost preparation method of fluorene copolymer containing thienopyrazine unit are provided.

The uses of said fluorene copolymer containing thienopyrazine unit are also provided in the embodiments of the present invention.

A fluorene copolymer containing thienopyrazine unit comprises copolymer represented by the following formula (I):

wherein $R_1$, $R_2$, $R_5$, $R_6$, $R_7$, $R_8$ are selected from H, $C_1$-$C_{20}$ alkyl; $R_3$, $R_4$ are selected from H, $C_1$-$C_{20}$ alkyl, $C_1$-$C_{20}$ alkoxyl, phenyl or phenoxyl; x+y=1, x≠0, y≠0; n is an integer of 1 to 200, $Ar_1$ is thiophene unit-containing group.

A preparation method of fluorene copolymer containing thienopyrazine unit, comprising:

providing compounds A, B and C, the compounds are represented by the following formulas, respectively:

A:

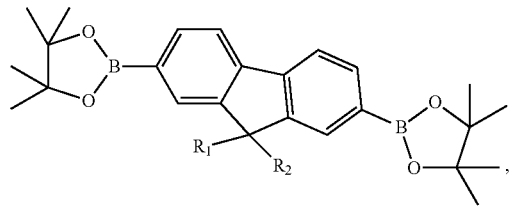

B:

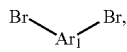

C:

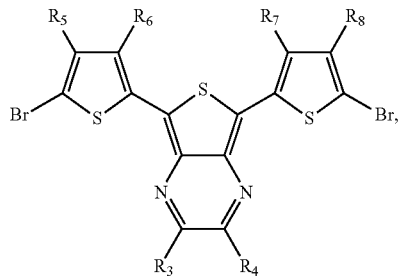

wherein $R_1$, $R_2$, $R_5$, $R_6$, $R_7$, $R_8$ are selected from H, $C_1$-$C_{20}$ alkyl; $R_3$, $R_4$ are selected from H, $C_1$-$C_{20}$ alkyl, $C_1$-$C_{20}$ alkoxyl, phenyl or phenoxyl, $Ar_1$ is thiophene unit-containing group;

in the presence of catalyst, alkaline solution and organic solvent, compounds A, B and C were carried out the Suzuki polymerization to produce the copolymer represented by the following formula (I):

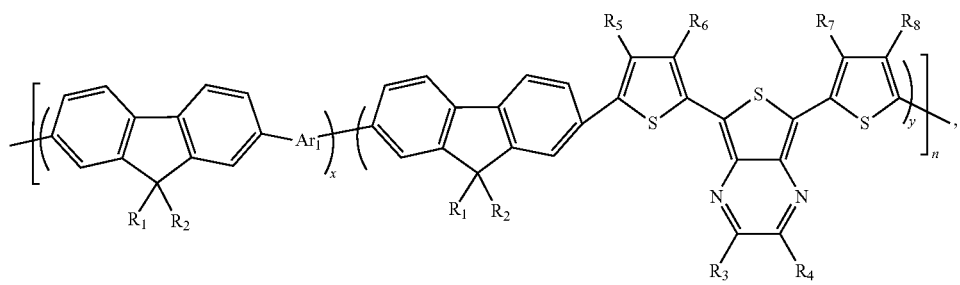

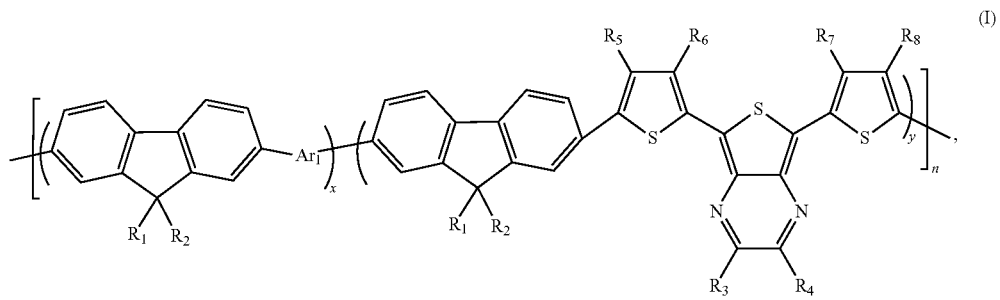

wherein x+y=1, x≠0, y≠0; n is an integer of 1 to 200.

And, the uses of said fluorene copolymer containing thienopyrazine unit according to any claim of claim 1-4 in organic optoelectronic materials, solar cell device, organic field effect transistors, organic light-emitting devices, organic optical storage devices, organic nonlinear materials or organic laser devices.

In said fluorene copolymer containing thienopyrazine unit which has thiophene unit structure, thiophene unit have five-member ring structure, which follows the Huckel rule, and have moderate band gap, wide wavelength range of spectrum response, good thermal and environmental stability. And, because said copolymer has fluorene units, fluorene units and thiophene unit are excellent donor materials and thiophene-thienopyrazine unit in copolymer is a kind of outstanding acceptor materials. Copolymer comprising such units can form a strong donor-acceptor structure. It is favorable for improving the stability of materials. On the other hand, it is also good for narrowing the band gap of the materials to broaden the absorption range of the materials to solar spectrum and improve the efficiency of photon-to-electron conversion. In said preparation method of fluorene copolymer containing thienopyrazine unit, simple synthetic route is provided to reduce the manufacturing cost. When said fluorene copolymer containing thienopyrazine unit is used in organic optoelectronic materials, solar cell device, organic field effect transistors, organic light-emitting devices, organic optical storage devices, organic nonlinear materials or organic laser devices, performance relating to optoelectronic or semiconductor of said fluorene copolymer containing thienopyrazine unit can be improved, and the weight of device is reduced, which enables it to be manufactured on a large scale.

BRIEF DESCRIPTION OF THE DRAWINGS

Further description of the present invention will be illustrated, which combined with embodiments in the drawings.

DETAILED DESCRIPTION OF ILLUSTRATED EMBODIMENTS

Figures 1, 2:
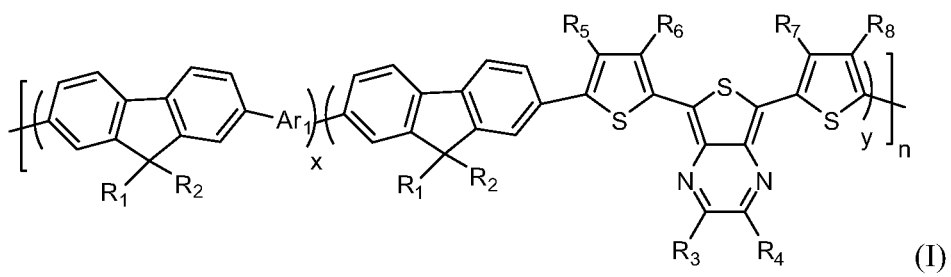
FIG. 1 shows the formula of fluorene copolymer containing thienopyrazine unit in the embodiments of the present invention.
FIG. 2 shows the flow chart of the preparation method of fluorene copolymer containing thienopyrazine unit in the embodiments of the present invention.

Further description of the present invention will be illustrated, which combined with embodiments in the drawings, in order to make the purpose, the technical solution and the advantages clearer. While the present invention has been described with reference to particular embodiments, it will be understood that the embodiments are illustrative and that the invention scope is not so limited.

Referring to FIG. 1, a fluorene copolymer containing thienopyrazine unit in the embodiments of the present invention comprises copolymer represented by the following formula (I):

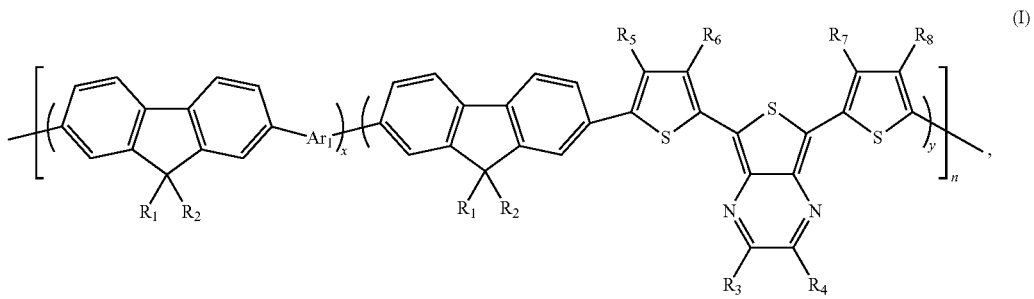

wherein $R_1$, $R_2$, $R_5$, $R_6$, $R_7$, $R_8$ are selected from H, $C_1$-$C_{20}$ alkyl; $R_3$, $R_4$ are selected from H, $C_1$-$C_{20}$ alkyl, $C_1$-$C_{20}$ alkoxyl, phenyl or phenoxyl; x+y=1, x≠0, y≠0; n is an integer of 1 to 200, $Ar_1$ is thiophene unit-containing group.

In said copolymer, $R_1$ and $R_2$ are preferably the same alkyl, $R_3$, $R_4$ are preferably the same alkyl, $R_5$ and $R_6$ are preferably the same alkyl, $R_7$ and $R_8$ are preferably the same alkyl, more preferably, $R_5$, $R_6$, $R_7$, $R_8$ are the same alkyl. $R_1$, $R_2$, $R_5$, $R_6$, $R_7$, $R_8$ are preferably alkyl, alkyl having more than 8 carbon atoms for example. $R_3$, $R_4$ are preferably alkyl, alkoxyl, phenyl or phenoxyl, such as alkyl having more than 8 carbon atoms, alkoxyl having more than 8 carbon atoms. In this way, the dissolubility and molecular weight of copolymer can be improved by the introduction of alkyl, alkoxyl, phenyl or phenoxyl into copolymer, achieving polymers which can be spin-coated or oligomers which can be spin-coated. n is preferably integer of 5 to 100.

$Ar_1$ in copolymer is preferably selected from groups represented by the following formulas (1) to (7):

(1):

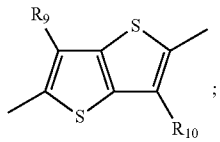

(2):

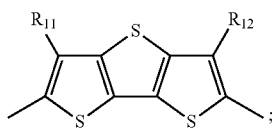

(3):

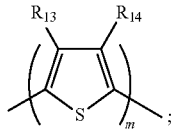

(4):

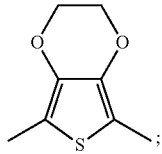

(5):

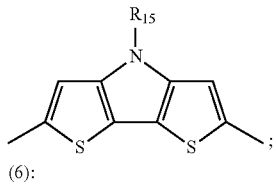

(6):

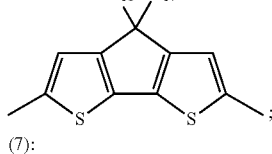

(7):

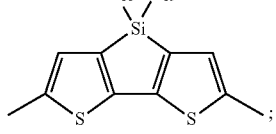

wherein $R_9$, $R_{10}$, $R_{11}$, $R_{12}$, $R_{13}$, $R_{14}$ are selected from H, $C_1$-$C_{20}$ alkyl, $R_{15}$, $R_{16}$, $R_{17}$, $R_{18}$, $R_{19}$ are selected from $C_1$-$C_{20}$ alkyl; m is the number of repeated units, m is an integer of 1 to 10, wherein $R_9$, $R_{10}$, $R_{11}$, $R_{12}$, $R_{13}$, $R_{14}$ are preferably alkyl, such as alkyl having more than 8 carbon atoms.

Said fluorene copolymer containing thienopyrazine unit comprises thiophene unit ($Ar_1$), which has moderate band gap, wide wavelength range of spectrum response, good thermal and environmental stability. And, because said copolymer has fluorene units, fluorene units and thiophene unit are excellent donor materials and thiophene-thienopyrazine unit in copolymer is a kind of outstanding acceptor materials. Copolymer comprising such units can form a strong donor-acceptor structure. It is favorable for improving the stability of materials. On the other hand, it is also good for narrowing the band gap of the materials to broaden the absorption range of the materials to solar spectrum and improve the efficiency of photon-to-electron conversion. Specifically, thieno[3,4-b]pyrazine which has good flat structure is an acceptor unit containing five-member ring and six-member ring backbone. It also has properties of charge transferring in molecule, and excellent electrochemical reduction property. Compared to common quinoxaline and other units, it has stronger electron withdrawing ability. Thieno[3,4-b]pyrazine unit also has ability of being modified, which can introduce electron donor groups and electron acceptor groups by using simple method to regulate its electron withdrawing performance. In the present embodiments, fluorene units and thiophene unit are introduced.

Therefore, generally speaking, in order to regulate band gap and reduction potential, thieno[3,4-b]pyrazine unit and thiophene unit are introduced into copolymer in the present embodiments, which effectively improves conjugation of molecule, showing favorable thermal stability and environmental stability. It is good for broadening spectral response range of copolymer to match emission spectrum of the sun. The range of spectral response waveband in the present embodiments is around 300-700 nm, which largely covers the visible light waveband.

Referring to FIG. 2, said preparation method of fluorene copolymer containing thienopyrazine unit, comprising:

S10: providing compounds A, B and C, the compounds are represented by the following formulas, respectively:

A:

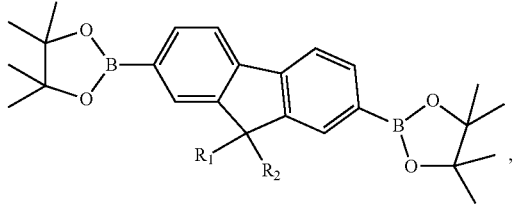

B:

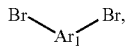

C:

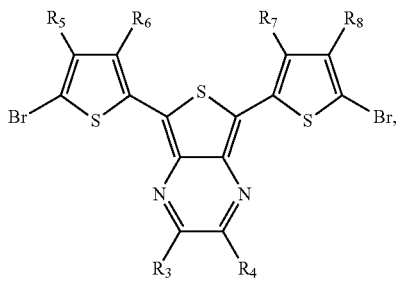

wherein $R_1$, $R_2$, $R_5$, $R_6$, $R_7$, $R_8$ are selected from H, $C_1$-$C_{20}$ alkyl; $R_3$, $R_4$ are selected from H, $C_1$-$C_{20}$ alkyl, $C_1$-$C_{20}$ alkoxyl, phenyl or phenoxyl, $Ar_1$ is thiophene unit-containing group;

S20: in the presence of catalyst, alkaline solution and organic solvent, compounds A, B and C were carried out the Suzuki polymerization to produce the copolymer represented by the following formula (I):

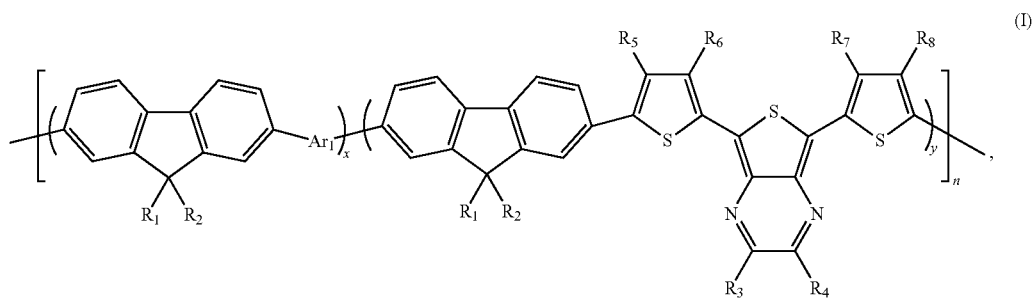

wherein x+y=1, x≠0, y≠0; n is an integer of 1 to 200.

In step S10, compound A, B and C can be obtained by purchasing on the market or prepared through the existing synthesis methods, wherein the structures of compound A, B and C are almost the same as the description of said fluorene copolymer containing thienopyrazine unit, which is not discussed here.

In the present embodiments, compound A, B and C are provided by the following preparation method.

Compound A is provided by the following steps: under oxygen-free conditions, adding alkyl lithium solution into 2,7-dibromo-9,9-dialkylfluorene (A') and organic solvent, stirring for 0.5 to 4 hours and then dripping 2-isopropoxy-4,4,5,5-tetramethyl-1,3,2-dioxaborolane, reacting, stirring for 24 to 48 hours to obtain compound A when it returns to room temperature. The oxygen-free conditions can be the protection environment or vacuum environment of nitrogen or inert gases. Alkyl lithium can be but not limited to n-butyl lithium, methyl lithium or other lithium compounds having 1-4 carbon atoms, preferably for n-butyl lithium. Organic solvent is preferably organic solvent of weak polarity or polar aprotic organic solvent, or mixed solution of them, such as, but not limited to tetrahydrofuran, ethanol, methanol, dichloroethane, trichloromethane, ethyl acetate, dimethylformamide, methylbenzene or acetone, etc., preferably for tetrahydrofuran, reacting temperature is preferably ranged from −78° C. to −25° C. Said preparing reaction is represented as follows:

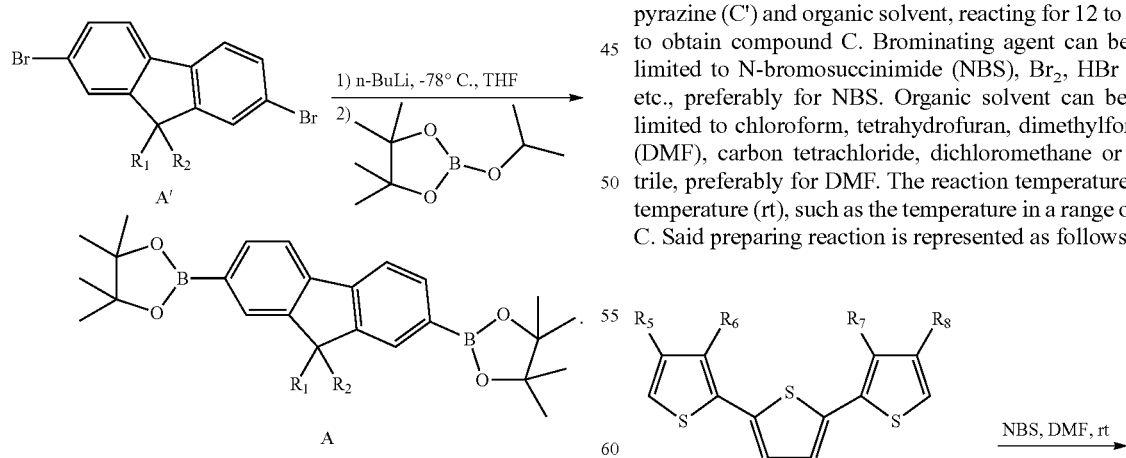

Moreover, the products are separated and purified after the reaction to obtain relatively pure compound A, specific description is given as follows: extracting reaction products with diethyl ether, drying with anhydrous magnesium sulfate, rotary evaporating, separating by column chromatography to obtain relatively pure compound A.

Compound B is provided by the following steps: under the conditions of ice-bath and keeping out of the sun, adding brominating agent in batches into $Ar_1$ monomer (B') and organic solvent, stirring for 4 to 48 hours to obtain compound B. Brominating agent can be but not limited to N-bromosuccinimide (NBS), $Br_2$, HBr or $PBr_3$, etc., preferably for NBS. Organic solvent can be but not limited to chloroform, tetrahydrofuran, dimethylformamide (DMF), carbon tetrachloride, dichloromethane or acetonitrile, preferably for DMF. Said preparing reaction is represented as follows:

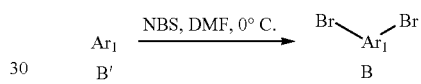

Moreover, the products are separated and purified after the reaction to obtain relatively pure compound B, specific description is given as follows: quenching reaction solution by pouring into ice water, extracting with dichloromethane, drying with anhydrous magnesium sulfate, rotary evaporating, recrystallizing or separating by column chromatography to obtain relatively pure compound B.

Compound C is provided by the following steps: keeping out of the sun, adding brominating agent in batches into 5,7-bis(3,4-dialkylthiophene-2-yl)-2,3-dialkylthieno[3,4-b]pyrazine (C') and organic solvent, reacting for 12 to 48 hours to obtain compound C. Brominating agent can be but not limited to N-bromosuccinimide (NBS), $Br_2$, HBr or $PBr_3$, etc., preferably for NBS. Organic solvent can be but not limited to chloroform, tetrahydrofuran, dimethylformamide (DMF), carbon tetrachloride, dichloromethane or acetonitrile, preferably for DMF. The reaction temperature is room temperature (rt), such as the temperature in a range of 20-25° C. Said preparing reaction is represented as follows:

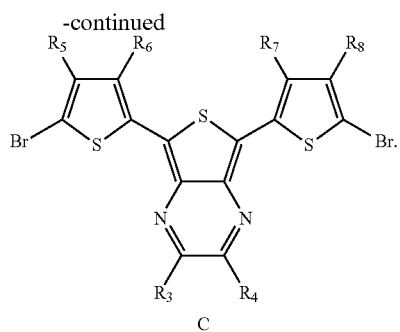

Moreover, the products are separated and purified after the reaction to obtain relatively pure compound C, specific description is given as follows: quenching reaction solution by pouring into ice water, extracting with dichloromethane, drying with anhydrous magnesium sulfate, rotary evaporating, recrystallizing or separating by column chromatography to obtain solid product, that is, relatively pure compound C.

In the step S20, Suzuki polymerization is represented as follows:

Catalyst is preferably organopalladium catalyst or mixture of organopalladium catalyst and organic phosphine ligands, the amount of catalyst is equivalent to 0.1% to 20% of the molar amount of compound A. Organopalladium catalyst is preferably at least one of $Pd_2(dba)_3/P(o\text{-}Tol)_3$, $Pd(PPh_3)_4$, $Pd(PPh_3)_2Cl_2$. Providing that the catalyst is mixture of organopalladium catalyst and organic phosphine ligands, the molar ratio of organopalladium catalyst to organic phosphine ligands is 1:2-20 Alkaline solution is metal hydroxide or aqueous solution of metal carbonate, aqueous solution of alkyl ammonium hydroxide, and the amount of said alkaline solution is 1 to 10 times as much as the molar amount of compound A. Metal hydroxide can be selected from sodium hydroxide solution, potassium hydroxide solution. Metal carbonate solution can be selected from sodium carbonate solution, potassium carbonate solution, etc., preferably for sodium carbonate solution. Alkyl ammonium hydroxide can be but not limited to tetramethyl ammonium hydroxide, tetraethyl ammonium hydroxide, tetrapropyl ammonium hydroxide, tetrabutyl ammonium hydroxide and other aqueous solution. Organic solvent is organic solvent of weak polarity or polar aprotic organic solvent, or mixed solution of

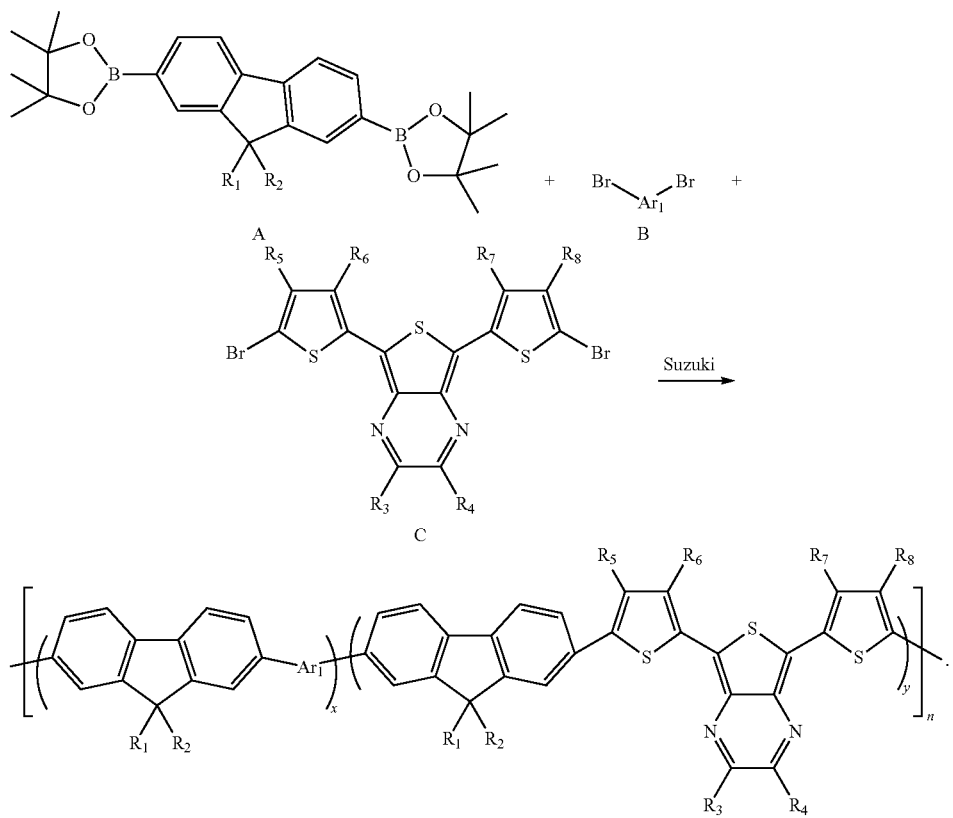

Suzuki polymerization specifically comprises the following steps: under oxygen-free conditions, mixing compound A, B and C in terms of the molar ratio of 1.0:a:b, adding catalyst, alkaline solution and organic solvent, heating to 50 to 150° C. and reacting for 2 to 7 days, then adding bromobenzene and reacting for 12 to 24 hours, after that, adding phenylboronic acid and reacting for 12 to 24 hours, wherein a>0, b>0, a+b=1.0.

Wherein, the oxygen-free conditions are almost the same as the conditions provided in the preparation of compound A.

them. Such as, it can be but not limited to tetrahydrofuran, dichloromethane, dimethoxyethane, benzene or methylbenzene, etc., preferably for methylbenzene. Sufficient amount of organic solvent enables various reactants to dissolve and react completely.

In addition, the products of Suzuki polymerization is purified after being obtained, the purification is conducted as follows: at the end of Suzuki polymerization, products are obtained and subsided with methanol for many times, pump filtrating, and vacuum drying to obtain solid products.

In said preparation method of fluorene copolymer containing thienopyrazine unit, the synthetic routes of compound A, B and C monomers are relatively simple and ripe, so that both the process and manufacturing cost are reduced. And, Suzuki polymerization is a kind of ripe polymerization, which has advantages of high productivity, mild reaction condition and easily being controlled. The solubility of products can be also easily improved by introducing alkyl or alkoxyl.

The fluorene copolymer containing thienopyrazine unit of the present embodiments can be implemented in kinds of optoelectronic or semiconductor devices, such as, in organic optoelectronic materials, solar cell device, organic field effect transistors, organic light-emitting devices, organic optical storage devices, organic nonlinear materials and organic laser devices, etc. Wherein, organic optoelectronic materials include said fluorene copolymer containing thienopyrazine unit, which is used as electron donor material and/or photon-to-electron conversion material, etc. Further description will be illustrated, taking solar cell devices, organic field effect transistors, and organic light-emitting devices as examples. Others like organic optical storage devices, organic nonlinear materials and organic laser devices are similar to the followings, which all use the fluorene copolymer containing thienopyrazine unit in the present embodiments as their optical storage material, nonlinear materials, laser materials or semiconductor materials, etc.

Figure 3:
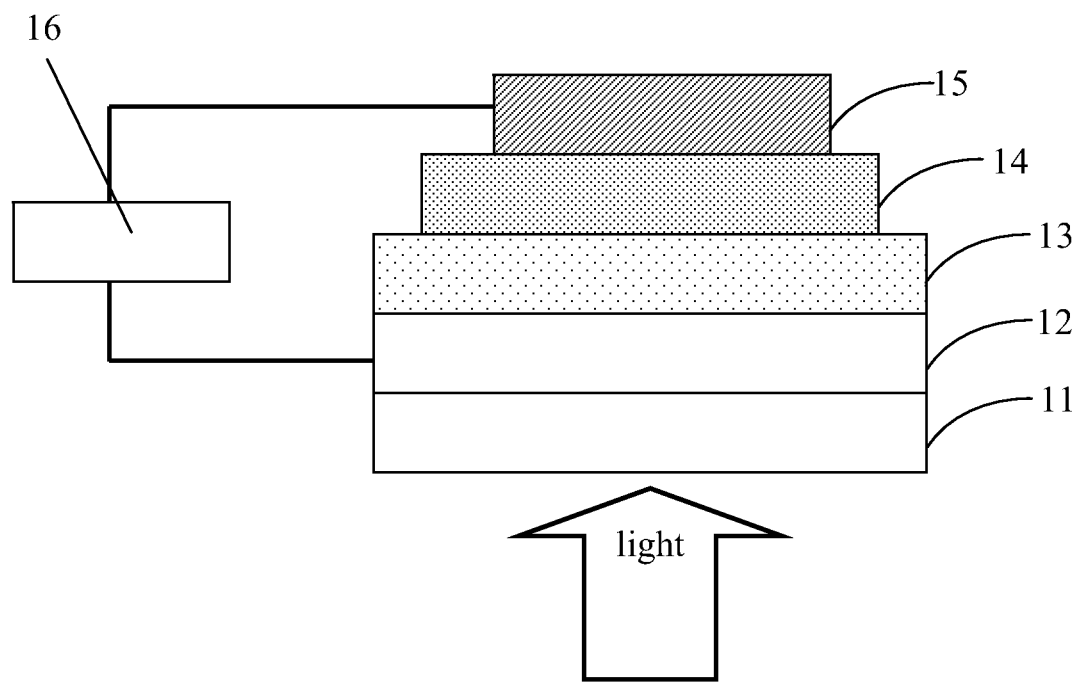
FIG. 3 shows the structure diagram of solar cell device with the fluorene copolymer containing thienopyrazine unit in the embodiments of the present invention.

Referring to FIG. 3, displays use solar cell device of said fluorene copolymer containing thienopyrazine unit of the present embodiments, which includes glass base layer 11, transparent anode 12, middle auxiliary layer 13, active layer 14, cathode 15, which stack successively. Auxiliary layer 13 uses polyethylene 3,4-thiophene: polystyrene-sulfuric acid composite (abbr. PEDOT:PSS), active layer 14 includes electron donor material and electron acceptor material, electron donor material uses said fluorene copolymer containing thienopyrazine unit, electron acceptor material can be [6,6] phenyl-$C_{61}$-methyl butyrate (abbr. PCBM). Transparent anode 12 can be indium tin oxide (abbr. ITO), preferably for indium tin oxide with square resistance of 10 to 20Ω. The cathode 15 can be aluminum electrode, but not limited to it. Wherein, glass basement 11 can be the bottom layer. During the making, deposit ITO electrode on glass basement 11, and then forming middle auxiliary layer 13 in ITO electrode by oxygen-plasma spraying (oxygen-Plasma) treatment process, and deposit fluorene copolymer containing thienopyrazine unit and electron acceptor materials on middle auxiliary layer 13 by means of vacuum evaporation to form an active layer 14. Then deposit cathode 15 on the active layer 14 through vacuum evaporation to obtain the above-mentioned solar cell devices.

As shown, in the light, the light goes through glass base layer 11 and ITO electrode 12. Fluorene copolymer containing thienopyrazine unit in active layer 14 absorbs solar energy, and generates excitons. The excitons migrate to the interface of electron donor/acceptor of material, and transfer electrons to the electron acceptor material, such as PCBM, achieving in charge separation and free carrier, namely, free electrons and holes. These free electrons pass along the electron acceptor material to the metal cathode and are collected by cathode, free holes pass along electron donor material to the ITO anode and are collected by anode to generate photocurrent and photovoltage, achieving photon-to-electron conversion. When it connects to load 16, it can be supplied with power. In this process, because of its very wide wavelength range of spectrum response, fluorene copolymer containing thienopyrazine unit is able to make better use of solar energy, in order to obtain a higher photon-to-electron conversion efficiency, to increase the electricity production capacity of solar cell devices. And this organic material can reduce quality of solar cell devices, and be produced by means of vacuum evaporation and other technologies, facilitate to manufacture on a large scale.

Figure 4:
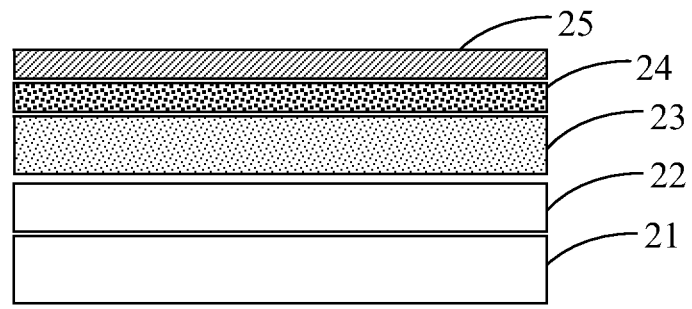
FIG. 4 shows the structure diagram of organic light-emitting device with the fluorene copolymer containing thienopyrazine unit in the embodiments of the present invention.

Referring to FIG. 4, displays use organic light-emitting device of fluorene copolymer containing thienopyrazine unit of the present embodiment, which includes glass base layer 21, transparent anode 22, light-emitting layer 23, buffer layer 24, cathode 25, which stack successively. Transparent anode 22 can be indium tin oxide (abbr. ITO), preferably for indium tin oxide with square resistance of 10 to 20Ω. Light-emitting layer 23 includes said fluorene copolymer containing thienopyrazine unit of the embodiment. The buffer layer 24 can be LiF, etc, but not limited to it. Cathode 25 can be but not limited to metal Al or Ca, Ba, etc. Thus, in a specific embodiment, the organic light-emitting device structure is expressed as: ITO/fluorene copolymer containing thienopyrazine unit/LiF/Al. Layers can be formed by the existing methods, while fluorene copolymer containing thienopyrazine unit can be formed on ITO by means of vacuum evaporation.

Figure 5:
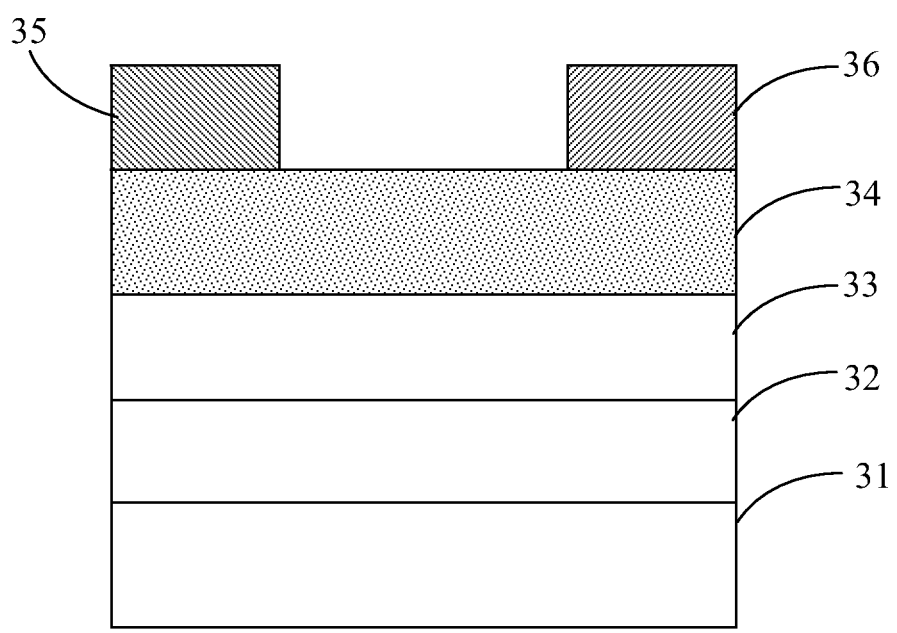
FIG. 5 shows the structure diagram of organic field effect transistors with the fluorene copolymer containing thienopyrazine unit in the embodiments of the present invention.

Referring to FIG. 5, displays use the organic field-effect transistor of fluorene copolymer containing thienopyrazine unit of said embodiment, which includes substrates 31, the insulating layer 32, the modified layer 33, the organic semiconductor layer 34 and, source electrode 35 and a drain electrode 36 set on organic semiconductor layer 34, which stack successively. Wherein, the substrate 31 can be but not limited to highly doped silicon (Si), the insulating layer 32 can be but not limited to $SiO_2$ of micro-nano (450 nm for example) thickness. Organic semiconductor layer 34 uses said fluorene copolymer containing thienopyrazine unit. Source electrode 35 and drain 36 can use but not limited to gold. Modified layer 33 can be but not limited to octadecyltrichlorosilane. Substrate 31, insulating layer 32, the modified layer 33, source electrode 35 and drain 36 can be formed by the existing methods. the vacuum degree can be close to $10^{-4}$ Pa, where the fluorene copolymer containing thienopyrazine unit of said embodiment is vacuum evaporated on the insulating layer 32 which is modified by the modified layer 33.

Special embodiments are disclosed as follows to demonstrate preparation method of fluorene copolymer containing thienopyrazine unit and the performance of it.

EXAMPLE 1

In the fluorene copolymer containing thienopyrazine unit of the present embodiment, $R_1$ and $R_2$ are methyl, $R_3$-$R_{10}$ are H, which is represented by the following formula:

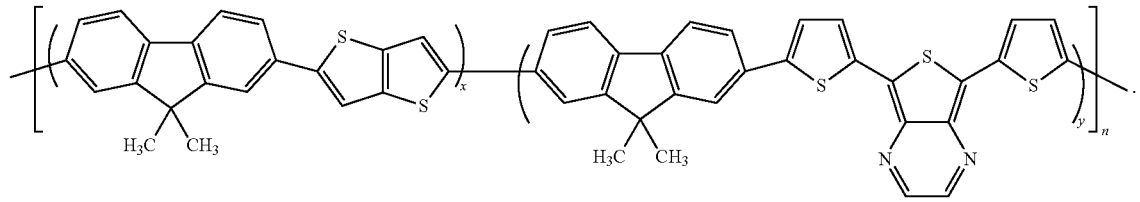

It can be seen from the formula that, fluorene copolymer containing thienopyrazine unit of the present embodiment, the alkyl of fluorenyl units is the same, $R_3$-$R_{10}$ are H. Materials made from such copolymer have light weight and relatively high yield during the preparation process as well. Also, with such relatively symmetrical structure, fluorene copolymer containing thienopyrazine unit is endowed with excellent optical absorbance properties and optoelectronic properties, etc.

Specific preparation steps of said copolymer are described as follows: Firstly, preparation of 2,7-bis(4,4,5,5-tetramethyl-1,3,2-dioxaborolan-yl)-9,9-dimethylfluorene (i.e. an embodiment of compound A), which is represented by the following formula:

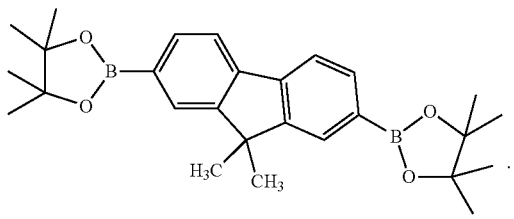

Specific preparation process is described as follows: in the presence of nitrogen and at the temperature of −78° C., adding 30.00 mL (2.00 M) n-butyl lithium solution into reactor containing 8.80 g 2,7-dibromo-9,9-dimethylfluorene and 100 mL tetrahydrofuran, after a two-hour stirring, dripping 13.00 mL 2-isopropoxy-4,4,5,5-tetramethyl-1,3,2-dioxaborolane slowly, stirring for 25 hours when it returns to room temperature. After the reaction, pouring reacting solution into water, extracting with diethyl ether, drying with anhydrous magnesium sulfate, rotary evaporating, separating by column chromatography to obtain solid products. The test result is: MALDI-TOF-MS (m/z): 446.3 (M⁺).

Secondly, preparation of 2,5-dibromothieno[3,2-b]thiophene (i.e. an embodiment of compound B), which is represented by the following formula:

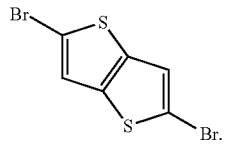

Specific preparation process is described as follows: under the conditions of ice-bath and keeping out of the sun, adding 7.83 g NBS in batches into reactor containing 2.80 g thieno[3,2-b]thiophene and 60 mL DMF, stirring for 12 hours at room temperature. After the reaction, quenching reaction solution by pouring into ice water, extracting with dichloromethane, drying with anhydrous magnesium sulfate, rotary evaporating, separating by column chromatography to obtain solid products. The test result is: MALDI-TOF-MS (m/z): 298.0 (M⁺).

Thirdly, preparation of 5,7-bis(5-bromothiophene-2-yl)thieno[3,4-b]pyrazine (i.e. an embodiment of compound C), which is represented by the following formula:

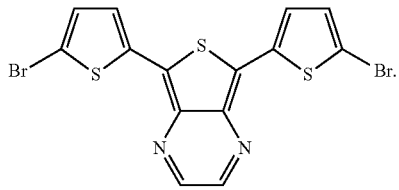 [SMILES: Brc1ccc(-c2sc(-c3ccc(Br)s3)c3nccnc23)s1]

Specific preparation process is described as follows: keeping out of the sun and at the room temperature, adding 3.96 g NBS into reactor containing 3.00 g 5,7-bis(thiophene-2-yl)thieno[3,4-b]pyrazine and 50 mL DMF, stirring for 25 hours at room temperature. After the reaction, extracting with dichloromethane, drying with anhydrous magnesium sulfate, rotary evaporating, recrystallizing to obtain solid product. The test result is: MALDI-TOF-MS (m/z): 458.2 (M⁺).

Fourthly, preparation of fluorene copolymer.

Specific preparation process is described as follows: under the protection of nitrogen, adding 8 mL 20 wt % aqueous solution of tetraethyl ammonium hydroxide and methylbenzene (20 mL) into reactor containing 0.446 g 2,7-bis(4,4,5,5-tetramethyl-1,3,2-dioxaborolan-yl)-9,9-dimethylfluorene, 0.0298 g 2,5-dibromothieno[3,2-b]thiophene, 0.412 g 5,7-bis(5-bromothiophene-2-yl)thieno[3,4-b]pyrazine, 0.208 g Pd(PPh₃)₄. After a one-hour replacement reaction with nitrogen, heating to 100° C., reacting for 55 hours. Adding 1.1 mL bromobenzene and reacting for 14 hours, after that, adding 0.011 g phenylboronic acid and reacting for 14 hours. After the reaction, products are subsided with methanol for three times, pump filtrating, and vacuum drying to obtain solid products in about 65% yield. The test result is: GPC: Mn is 4967, PDI is 1.7.

EXAMPLE 2

In the fluorene copolymer containing thienopyrazine unit of the present embodiment, $R_1$, $R_2$, $R_9$, $R_{10}$ are methyl, $R_3$-$R_8$ are H, which is represented by the following formula:

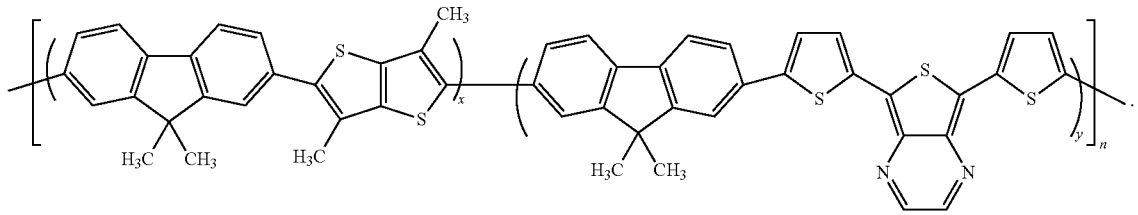

It can be seen from the formula, the structures of fluorene copolymer containing thienopyrazine unit of the Example 1 and Example 2 are almost the same, the difference between them lies in $Ar_1$ unit. Thus, fluorene copolymer containing thienopyrazine unit of the Example 2 has properties and effects similar to that of the copolymer of the Example 1. The preparation steps of fluorene copolymer containing thienopyrazine unit of the Example 1 and Example 2 are also approximately the same, the difference between them lies in the preparation processes of compound B and end copolymer. Thus, preparation processes of compound A and C can be conducted with reference to the description of Example 1, which are not discussed here.

Preparation process of compound B of the present embodiment is described as follows:

1) preparation of 3,6-dimethylthieno[3,2-b]thiophene, which is represented by the following formula:

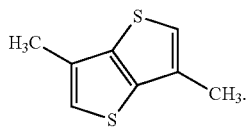

Specific implementation of step 1) is: adding 6.00 g 3,6-dibromothieno[3,2-b]thiophene and 66 mg [1,1'-bis(diphenylphosphino)ferrocene]dichloropalladium(II) into 100 mL tubular glass container with stirring rob, sealing, purging with nitrogen. Adding 15 mL tetrahydrofuran and 25 mL methylzinc bromide (in 1.0 M tetrahydrofuran solution), stirring at room temperature for 10 minutes, heating in microwave reactor at 140° C. for 50 minutes. Cooling, diluting with MTBE (methyl tertiary butyl ether), washing with diluted HCl solution, washing with saline, drying with anhydrous sodium sulfate, pump filtrating, and rotary evaporating. Separating by column chromatography, and recrystallizing to obtain solid products. The test result is: MALDI-TOF-MS (m/z): 168.3 ($M^+$).

2) preparation of 2,5-dibromo-3,6-dimethylthieno[3,2-b]thiophene, which is the compound B of the present embodiment. The formula is as follows:

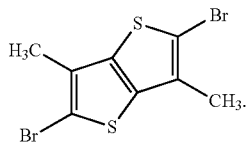

Specific implementation of step 2) is: under the conditions of ice-bath and keeping out of the sun, adding 16.00 g NBS in batches into reactor containing 6.72 g 3,6-dimethylthieno[3,2-b]thiophene and 200 mL DMF, stirring for 24 hours at room temparature. After the reaction, quenching reaction solution by pouring into ice water, extracting with dichloromethane, drying with anhydrous magnesium sulfate, rotary evaporating, separating by column chromatography to obtain solid products. The test result is: MALDI-TOF-MS (m/z): 326.1 ($M^+$).

Preparation process of copolymer of the present embodiment is described as follows: under the protection of nitrogen, adding 15 mL 20 wt % aqueous solution of tetraethyl ammonium hydroxide and methylbenzene (40 mL) into reactor containing 0.893 g 2,7-bis(4,4,5,5-tetramethyl-1,3,2-dioxaborolan-yl)-9,9-dimethyl fluorene, 0.293 g 2,5-dibromo-3,6-dimethylthieno[3,2-b]thiophene, 0.0458 g 5,7-bis(5-bromothiophene-2-yl)thieno[3,4-b]pyrazine, 0.126 g $Pd(PPh_3)_4$. After a one-hour replacement reaction with nitrogen, heating to 90° C., reacting for 49 hours. Adding 2.0 mL bromobenzene and reacting for 16 hours, after that, adding 0.020 g phenylboronic acid and reacting for 16 hours. After the reaction, products are subsided with methanol for three times, pump filtrating, and vacuum drying to obtain solid products in about 68% yield. The test result is: GPC: Mn is 16904, PDI is 1.5.

EXAMPLE 3

In the fluorene copolymer containing thienopyrazine unit of the present embodiment, $R_1$ and $R_2$ are methyl, $R_3$ and $R_4$ are methyl, $R_5$-$R_{10}$ are H, and the formula is represented as follows:

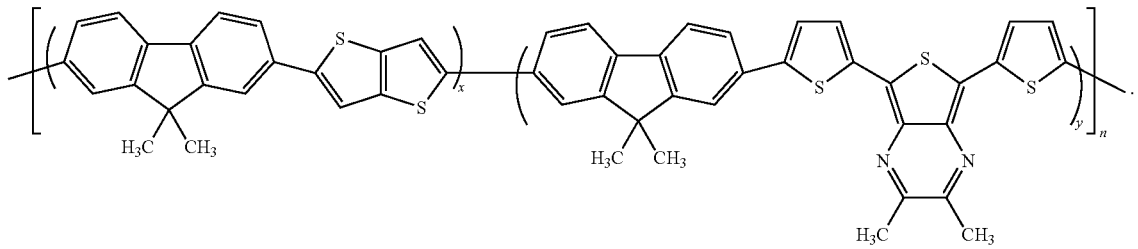

It can be seen from the formula that, the structures of fluorene copolymer containing thienopyrazine unit of the Example 1 and Example 3 are almost the same, the difference between them lies in $R_3$ and $R_4$ of the present Example 3, which are methyl. Thus, fluorene copolymer containing thienopyrazine unit of the Example 3 has properties and effects similar to that of the copolymer of the Example 1. In addition, the dissolubility is further enhanced because that $R_3$ and $R_4$ are methyl. The preparation steps of fluorene copolymer containing thienopyrazine unit of the Example 1 and Example 2 are also approximately the same, the difference between them lies in the preparation processes of compound C and end copolymer. Thus, preparation processes of compound A and B are not discussed here.

Preparation process of compound C of the present embodiment is described as follows:

1) preparation of 2,3-dimethyl-5,7-dithiophene-2-yl-thieno[3,4-b]pyrazine, which is represented by the following formula:

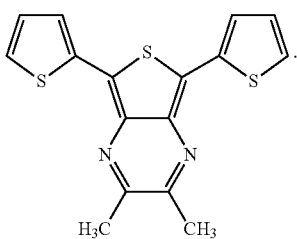 [SMILES: Cc1nc2c(-c3cccs3)sc(-c3cccs3)c2nc1C]

specific implementation of step 1) is: in the presence of nitrogen, dissolving 2.78 g 2,5-bis(2-thienyl)-3,4-diaminothiophene in 50 mL ethanol, heating to 70° C., dripping 1.20 g 2,3-butanedione and 20 mL ethanol, reacting for 10 hours. After the reaction, reduce the pressure to remove solvent when it returns to room temperature, separating by column chromatography and then recrystallizing to obtain solid products. MALDI-TOF-MS (m/z): 328.5 (M$^+$).

2) preparation of 5,7-bis(5-bromothiophene-2-yl)-2,3-dimethyl-thieno[3,4-b]pyrazine, which is the compound C of the present embodiment. The formula is as follows:

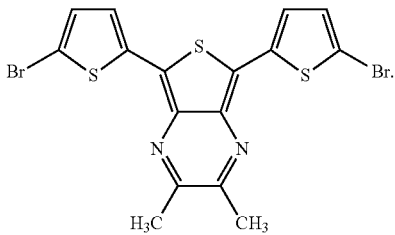 [SMILES: Cc1nc2c(-c3ccc(Br)s3)sc(-c3ccc(Br)s3)c2nc1C]

specific implementation of step 2) is: keeping out of the sun and at the room temperature, adding 3.76 g NBS in batches into reactor containing 3.29 g 2,3-dimethyl-5,7-dithiophene-2-yl-thieno[3,4-b]pyrazine and 100 mL DMF, stirring for 22 hours. After the reaction, quenching reaction solution by pouring into ice water, extracting with dichloromethane, drying with anhydrous magnesium sulfate, rotary evaporating, separating by column chromatography to obtain solid product. The test result is: MALDI-TOF-MS (m/z): 486.3 (M$^+$).

Preparation process of copolymer of the present embodiment is described as follows:

Under the protection of nitrogen, adding 7 mL 20 wt % aqueous solution of tetraethyl ammonium hydroxide and methylbenzene (30 mL) into reactor containing 0.446 g 2,7-bis(4,4,5,5-tetramethyl-1,3,2-dioxaborolan-yl)-9,9-dimethylfluorene, 0.150 g 2,5-dibromothieno[3,2-b]thiophene, 0.243 g 5,7-bis(5-bromothiophene-2-yl)-2,3-dimethyl-thieno[3,4-b]pyrazine, 0.147 g Pd(PPh$_3$)$_4$. After a two-hour replacement reaction with nitrogen, heating to 120° C., reacting for 49 hours. Adding 1.1 mL bromobenzene and reacting for 14 hours, after that, adding 0.011 g phenylboronic acid and reacting for 14 hours. After the reaction, products are subsided with methanol for three times, pump filtrating, and vacuum drying to obtain solid products in about 61% yield. The test result is: GPC: Mn is 20168, PDI is 1.5.

EXAMPLE 4

In the fluorene copolymer containing thienopyrazine unit of the present embodiment, $R_1$, $R_2$, $R_3$, $R_4$, $R_9$ and $R_{10}$ are $C_8H_{17}$, $R_5$-$R_8$ are H, which is represented by the following formula:

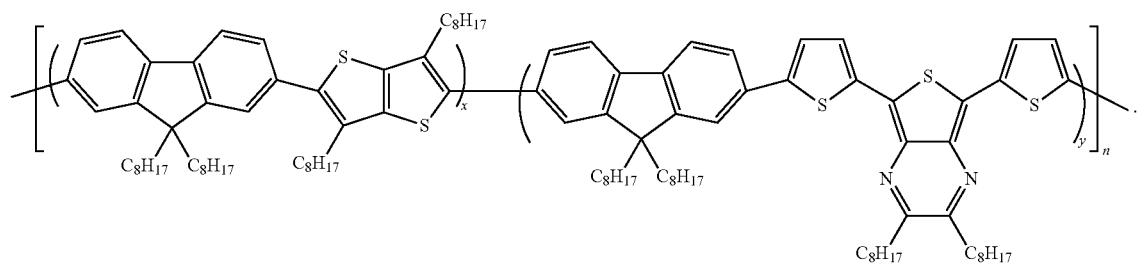

It can be seen from the formula that, the fluorene copolymer containing thienopyrazine unit of the present embodiment has multiple $C_8H_{17}$ groups. Thus, it has the properties and effects described in the above embodiments, besides, the dissolubility and molecular weight of copolymer can be improved, and it is easy to achieve copolymers which can be spin-coated or oligomers which can be spin-coated.

Preparation process of copolymer of the present embodiment is described as follows:

Firstly, preparation of 2,7-bis(4,4,5,5-tetramethyl-1,3,2-dioxaborolan-yl)-9,9-dioctylfluorene, which is represented by the following formula:

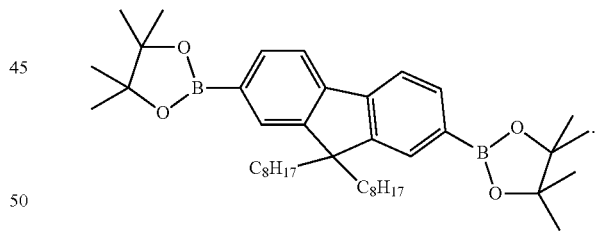

Specific preparation process is described as follows: in the presence of nitrogen and at the temperature of −78° C., adding 23.00 mL (2.00 M) n-butyl lithium solution with injector into 2-neck flask containing 11.00 g 2,7-dibromo-9,9-dioctylfluorene and 100 mL tetrahydrofuran, after a two-hour stirring, dripping 9.80 mL 2-isopropoxy-4,4,5,5-tetramethyl-1,3,2-dioxaborolane slowly, stirring for 25 hours when it returns to room temperature. After the reaction, pouring reacting solution into water, extracting with diethyl ether, drying with anhydrous magnesium sulfate, rotary evaporating, separating by column chromatography to obtain solid products. The test result is: MALDI-TOF-MS (m/z): 642.6 (M$^+$).

Secondly, preparation of 3,6-dioctylthieno[3,2-b]thiophene, which is represented by the following formula:

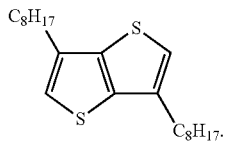

specific preparation process is described as follows: adding 2.00 g 3,6-dibromothieno[3,2-b]thiophene and 22 mg [1,1'-bis(diphenylphosphino)ferrocene]dichloropalladium(II) into 50 mL tubular glass container with stirring rob, sealing, purging with nitrogen. Adding 15 mL tetrahydrofuran and 19 mL octylzinc bromide (in 1.0 M tetrahydrofuran solution), stirring at room temperature for 15 minutes, heating in microwave reactor at 150° C. for 40 minutes. Cooling, diluting with MTBE, and washing with diluted HCl solution, washing with saline, drying with anhydrous sodium sulfate, pump filtrating, and rotary evaporating. Separating by column chromatography, and recrystallizing to obtain solid products. The test result is: MALDI-TOF-MS (m/z): 364.7 (M$^+$).

Thirdly, preparation of 2,5-dibromo-3,6-dioctylthieno[3,2-b]thiophene, which is represented by the following formula:

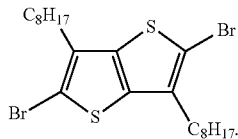

specific preparation process is described as follows: under the conditions of ice-bath and keeping out of the sun, adding 1.97 g NBS in batches into reactor containing 2.02 g 3,6-dioctylthieno[3,2-b]thiophene and 60 mL DMF, stirring at the room temperature for 15 hours. After the reaction, quenching reaction solution by pouring into ice water, extracting with dichloromethane, drying with anhydrous magnesium sulfate, rotary evaporating, separating by column chromatography to obtain solid product. The test result is MALDI-TOF-MS (m/z): 522.5 (M$^+$).

Fourthly, preparation of 2,3-dioctyl-5,7-dithiophene-2-yl-thieno[3,4-b]pyrazine, which is represented by the following formula:

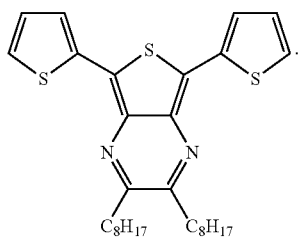

Specific preparation process is described as follows: in the presence of nitrogen, dissolving 5.56 g 2,5-bis(2-thienyl)-3,4-diaminothiophene in 80 mL ethanol, heating to 70° C., dripping 6.77 g octadecane-9,10-dione and 50 mL ethanol solution, reacting for 16 hours. After the reaction, reduce the pressure to remove solvent when it returns to room temperature, separating by column chromatography and then recrystallizing to obtain solid products. The test result is: MALDI-TOF-MS (m/z): 524.9 (M$^+$).

Fifthly, preparation of 5,7-bis(5-bromothiophene-2-yl)-2,3-dioctyl-thieno[3,4-b]pyrazine, which is represented by the following formula:

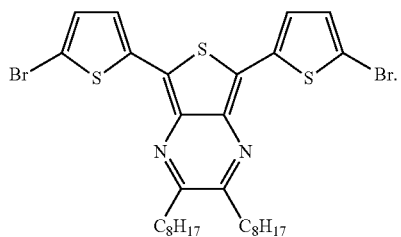

Specific preparation process is described as follows: keeping out of the sun and at the room temperature, adding 3.69 g NBS in batches into reactor containing 5.25 g 2,3-dimethyl-5,7-dithiophene-2-yl-thieno[3,4-b]pyrazine and 80 mL DMF, stirring for 24 hours. After the reaction, quenching reaction solution by pouring into ice water, extracting with dichloromethane, drying with anhydrous magnesium sulfate, rotary evaporating, separating by column chromatography to obtain solid product. MALDI-TOF-MS (m/z): 682.6 (M$^+$).

Sixthly, preparation of fluorene copolymer of the present embodiment.

Specific process is described as follows: under the protection of nitrogen, adding 5 mL 20% Wt aqueous solution of tetraethyl ammonium hydroxide and methylbenzene (30 mL) into reactor containing 0.645 g 2,7-bis(4,4,5,5-tetramethyl-1,3,2-dioxaborolan-yl)-9,9-dioctylfluorene, 0.262 g 2,5-dibromo-3,6-dioctylthieno[3,2-b]thiophene, 0.342 g 5,7-bis(5-bromothiophene-2-yl)-2,3-dioctyl-thieno[3,4-b]pyrazine, 0.0986 g Pd(PPh$_3$)$_4$. After a two-hour replacement reaction with nitrogen, heating to 50° C., reacting for 72 hours. Adding 0.9 mL bromobenzene and reacting for 16 hours, after that, adding 0.0090 g phenylboronic acid and reacting for 16 hours. After the reaction, products are subsided with methanol for three times, pump filtrating, and vacuum drying to obtain solid products in about 66% yield. The test result is: GPC:Mn is 66735, PDI is 1.8.

EXAMPLE 5

In the fluorene copolymer containing thienopyrazine unit of the present embodiment, $R_1$, $R_2$, $R_3$, $R_4$, $R_5$, $R_8$, $R_9$ and $R_{10}$ are $C_{20}H_{41}$, $R_6$ and $R_7$ are H, which is represented by the following formula:

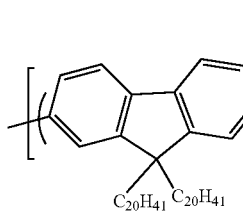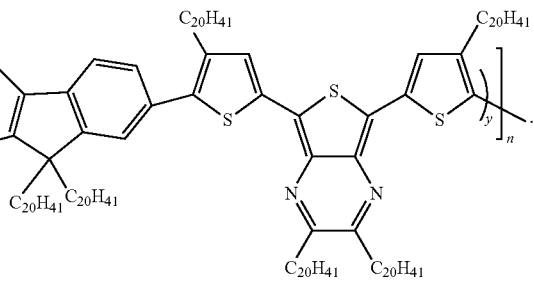

It can be seen from the formula that, the fluorene copolymer containing thienopyrazine unit of the present embodiment has multiple $C_8$-$H_{17}$ groups. Thus, it has the properties and effects described in the above embodiments, besides, the dissolubility and molecular weight of copolymer can be improved, and it is easy to achieve copolymers which can be spin-coated or oligomers which can be spin-coated.

Preparation process of copolymer of the present embodiment is described as follows:

Firstly, preparation of 2,7-bis(4,4,5,5-tetramethyl-1,3,2-dioxaborolan-yl)-9,9-dieicosylfluorene, which is represented by the following formula:

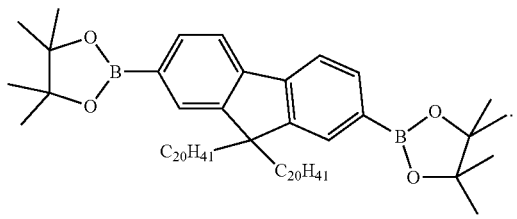

Specific preparation process is described as follows: in the presence of nitrogen and at the temperature of −78° C., adding 16.50 mL (2.00 M) n-butyl lithium solution into reactor containing 8.87 g 2,7-dibromo-9,9-dieicosylfluorene and 150 mL tetrahydrofuran, after a two-hour stirring, dripping 5.50 mL 2-isopropoxy-4,4,5,5-tetramethyl-1,3,2-dioxaborolane slowly, stirring for 44 hours when it returns to room temperature. After the reaction, pouring reacting solution into water, extracting with diethyl ether, drying with anhydrous magnesium sulfate, rotary evaporating, separating by column chromatography to obtain solid products. The test result is: MALDI-TOF-MS (m/z): 979.2 ($M^+$).

Secondly, preparation of 3,6-dieicosyl thieno[3,2-b] thiophene, which is represented by the following formula:

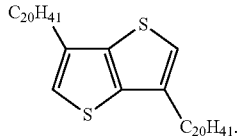

specific preparation process is described as follows: adding 3.02 g 3,6-dibromothieno[3,2-b]thiophene and 33 mg [1,1'-bis(diphenylphosphino)ferrocene]dichloropalladium(II) into 50 mL tubular glass container with stirring rob, sealing, purging with nitrogen. Adding 50 mL tetrahydrofuran and 25 mL eicosylzinc bromide (in 1.0 M tetrahydrofuran solution), stirring at room temperature for 18 minutes, heating in microwave reactor at 140° C. for 45 minutes. Cooling, diluting with MTBE, and washing with diluted HCl solution, washing with saline, drying with anhydrous sodium sulfate, pump filtrating, and rotary evaporating. Separating by column chromatography, and recrystallizing to obtain solid products. The test result is: MALDI-TOF-MS (m/z): 701.3 ($M^+$).

Thirdly, preparation of 2,5-dibromo-3,6-eicosyl thieno[3,2-b]thiophene, which is represented by the following formula:

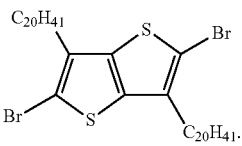

Specific preparation process is described as follows: under the conditions of ice-bath and keeping out of the sun, adding 3.77 g NBS in batches into reactor containing 6.98 g 3,6-dieicosyl thieno[3,2-b]thiophene and 70 mL DMF, stirring at the room temparature for 18 hours. After the reaction, quenching reaction solution by pouring into ice water, extracting with dichloromethane, drying with anhydrous magnesium sulfate, rotary evaporating, separating by column chromatography to obtain solid product. The test result is: MALDI-TOF-MS (m/z): 859.1 ($M^+$).

Fourthly, preparation of 2,3-dieicosyl-5,7-bis(3-eicosylthiophene) thieno[3,4-b]pyrazine, which is represented by the following formula:

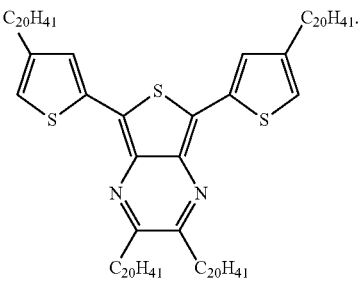

Specific preparation process is described as follows: in the presence of nitrogen, dissolving 8.39 g 2,5-bis(3-eicosylthiophene-5-yl)-3,4-diaminothiophene in 100 mL ethanol, heating to 80° C., dripping 8.05 g dotetracontane-21,22-dione and 50 mL ethanol solution, reacting for 18 hours. After the reaction, reduce the pressure to remove solvent when it returns to room temperature, separating by column chromatography and then recrystallizing to obtain solid products. The test result is: MALDI-TOF-MS (m/z): 1422.6 ($M^+$).

Fifthly, preparation of 2,3-dieicosyl-5,7-bis(2-bromo-3-eicosyl thiophene)thieno[3,4-b]pyrazine, which is represented by the following formula:

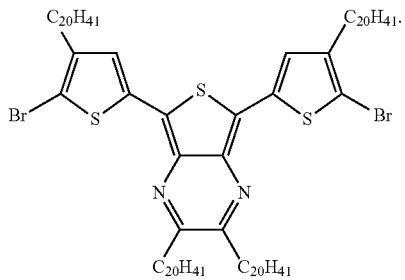

Specific preparation process is described as follows: keeping out of the sun and at the room temperature, adding 3.88 g NBS in batches into reactor containing 1.42 g 2,3-dieicosyl-5,7-bis(3-eicosylthiophene)thieno[3,4-b]pyrazine and 50 mL DMF, stirring for 25 hours. After the reaction, quenching reaction solution by pouring into ice water, extracting with dichloromethane, drying with anhydrous magnesium sulfate, rotary evaporating, separating by column chromatography to obtain solid product. The test result is: MALDI-TOF-MS (m/z): 1580.3 (M$^+$).

Sixthly, preparation of fluorene copolymer of the present embodiment.

Specific process is described as follows: under the protection of nitrogen, adding 20 mL aqueous solution of Na$_2$CO$_3$ (2 M) and methylbenzene (30 mL) into reactor containing 0.980 g 2,7-bis(4,4,5,5-tetramethyl-1,3,2-dioxaborolan-yl)-9,9-dieicosylfluorene, 0.429 g 2,5-dibromo-3,6-eicosyl thieno[3,2-b]thiophene, 0.790 g 2,3-dieicosyl-5,7-bis(2-bromo-3-eicosylthiophene)thieno[3,4-b]pyrazine, 0.0569 g Pd(PPh$_3$)$_4$. After a one-hour replacement reaction with nitrogen, heating to 150° C., reacting for 50 hours. Adding 1.2 mL bromobenzene and reacting for 12 hours, after that, adding 0.015 g phenylboronic acid and reacting for 12 hours. After the reaction, products are subsided with methanol for three times, pump filtrating, and vacuum drying to obtain solid products in about 58% yield. The test result is: GPC: Mn is 127930, PDI is 1.5.

While the present invention has been described with reference to particular embodiments, it will be understood that the embodiments are illustrative and that the invention scope is not so limited. Alternative embodiments of the present invention will become apparent to those having ordinary skill in the art to which the present invention pertains. Such alternate embodiments are considered to be encompassed within the spirit and scope of the present invention. Accordingly, the scope of the present invention is described by the appended claims and is supported by the foregoing description.

What is claimed is:

1. A fluorene copolymer containing thienopyrazine unit, which comprises copolymer represented by following formula (I):

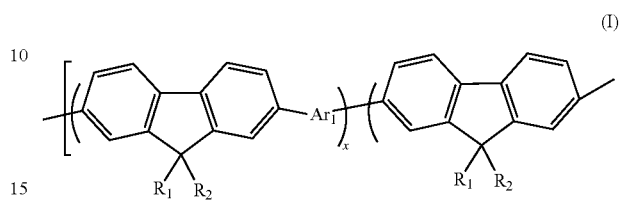

(I)

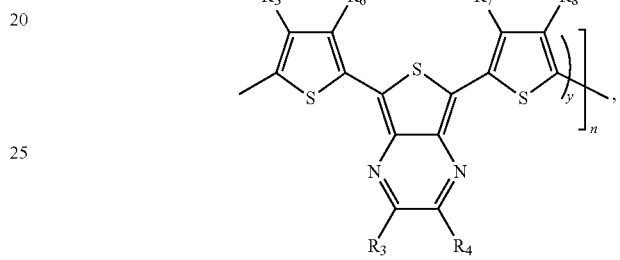

wherein R$_1$, R$_2$, R$_5$, R$_6$, R$_7$, R$_8$ are selected from H, C$_1$-C$_{20}$ alkyl; R$_3$, R$_4$ are selected from H, C$_{1-C20}$ alkyl, C$_1$-C$_{20}$ alkoxyl, phenyl or phenoxyl; x+y=1, x≠0, y≠0; n is an integer of 2 to 200, Ar$_1$ is thiophene unit-containing group, wherein said R$_1$ and R$_2$ are same alkyl, R$_3$ and R$_4$ are same alkyl, R$_5$ and R$_6$ are same alkyl, R$_7$ and R$_8$ are same alkyl.

2. The fluorene copolymer containing thienopyrazine unit according to claim 1, wherein said A$_1$ is selected from group represented by the following formulas:

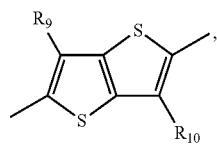

wherein R$_9$, R$_{10}$ are selected from H, C$_1$-C$_{20}$ alkyl.

3. A fluorene copolymer containing thienopyrazine unit, which comprises copolymer represented by following formula (I):

(I)

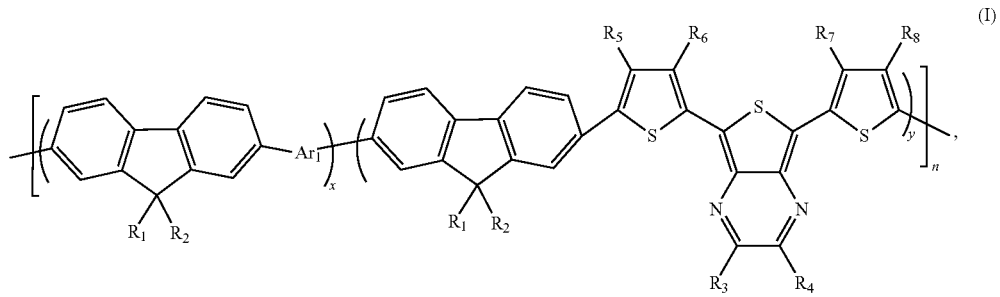

wherein $R_1, R_2, R_5, R_6, R_7, R_8$ are selected from H, $C_1$-$C_{20}$ alkyl; $R_3, R_4$ are selected from H, $C_1$-$C_{20}$ alkyl, $C_1$-$C_{20}$ alkoxyl, phenyl or phenoxyl; x+y=1, x≠0, y≠0; n is an integer of 2 to 200, $Ar_1$ is thiophene unit-containing group, wherein said $R_1, R_2, R_5, R_6, R_7, R_8$ are alkyl having more than 8 carbon atoms, $R_3$ and $R_4$ are alkyl having more than 8 carbon atoms, alkoxyl having more than 8 carbon atoms, phenyl or phenoxyl.

4. The fluorene copolymer containing thienopyrazine unit according to claim 3, wherein said $Ar_1$ is selected from group represented by the following formulas:

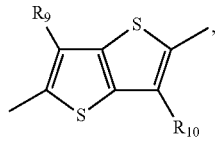

wherein $R_9, R_{10}$ are selected from H, $C_{1\text{-}C20}$ alkyl.

* * * * *